United States Patent
Mizunaga et al.

(10) Patent No.: US 12,204,256 B2
(45) Date of Patent: Jan. 21, 2025

(54) SUBSTRATE PROCESSING APPARATUS

(71) Applicant: Tokyo Electron Limited, Tokyo (JP)

(72) Inventors: Kouichi Mizunaga, Koshi (JP); Toshichika Takei, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 18/526,350

(22) Filed: Dec. 1, 2023

(65) Prior Publication Data

US 2024/0094645 A1    Mar. 21, 2024

Related U.S. Application Data

(63) Continuation of application No. 18/046,567, filed on Oct. 14, 2022, now Pat. No. 11,868,056.

(30) Foreign Application Priority Data

Oct. 15, 2021   (JP) ................................. 2021-169664
Aug. 9, 2022    (JP) ................................. 2022-126982

(51) Int. Cl.
*G03F 7/00* (2006.01)
*H01L 21/683* (2006.01)
*H01L 21/687* (2006.01)

(52) U.S. Cl.
CPC ...... *G03F 7/70875* (2013.01); *H01L 21/6838* (2013.01); *H01L 21/68742* (2013.01); *H01L 21/6875* (2013.01)

(58) Field of Classification Search
CPC ............ G03F 7/70875; H01L 21/6838; H01L 21/68742; H01L 21/6875; H01L 21/67103; H01L 21/67178; H01L 21/68735

See application file for complete search history.

(56) References Cited

U.S. PATENT DOCUMENTS

| | | | |
|---|---|---|---|
| 8,519,309 B2 | 8/2013 | Iwata et al. | |
| 8,748,780 B2 * | 6/2014 | Moro | C23C 16/46 269/21 |
| 11,049,738 B2 * | 6/2021 | Otani | H01L 21/6719 |
| 11,450,552 B2 | 9/2022 | Shirley | |
| 11,462,430 B2 * | 10/2022 | Zeng | H01L 21/68785 |
| 2022/0208547 A1 * | 6/2022 | Muramatsu | H01L 21/02356 |
| 2023/0118890 A1 | 4/2023 | Fujino et al. | |

FOREIGN PATENT DOCUMENTS

JP    2007-300047 A    11/2007
WO   2020/179283 A1    9/2020

* cited by examiner

*Primary Examiner* — Hung V Nguyen
(74) *Attorney, Agent, or Firm* — Pearne & Gordon LLP

(57) ABSTRACT

A heat treatment unit U2 includes a heat plate 20 configured to place a wafer W thereon and heat the wafer W placed thereon; multiple gap members 22 formed along a front surface 20a of the heat plate 20 on which the wafer W is placed, and configured to support the wafer W to secure a clearance V between the heat plate 20 and the wafer W; a suction unit 70 configured to suck the wafer W toward the heat plate 20; and an elevating pin 51 configured to penetrate the heat plate 20 and configured to be moved up and down to move the wafer W placed on the heat plate 20 up and down. The front surface 20a of the heat plate 20 has a concave region 20d inclined downwards from an outer side toward an inner side thereof.

15 Claims, 15 Drawing Sheets

| | TRANSIENT STATE | STEADY STATE |
|---|---|---|
| WAFER TEMPERATURE RANGE | 62.4°C | 6.5°C |

|  | IMPROVED BY 125 TIMES | IMPROVED BY 65 TIMES |
|---|---|---|
|  | TRANSIENT STATE | STEADY STATE |
| WAFER TEMPERATURE RANGE | 0.5°C | 0.1°C |

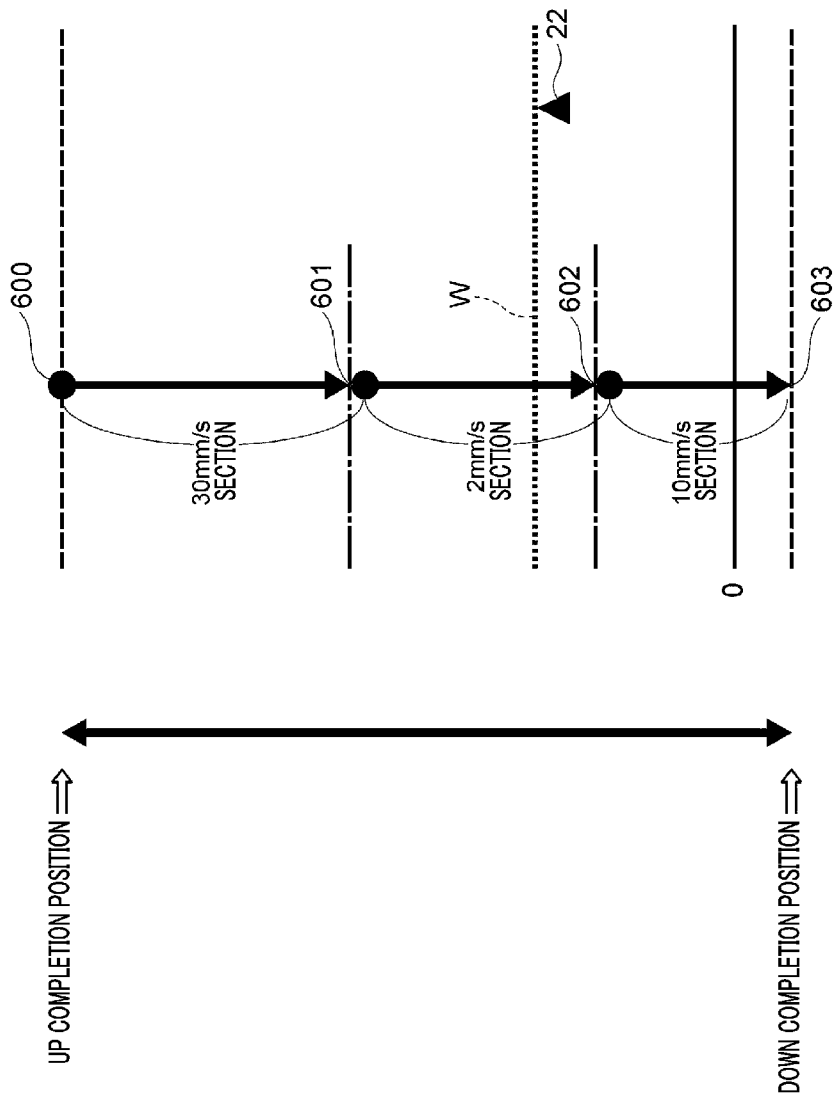

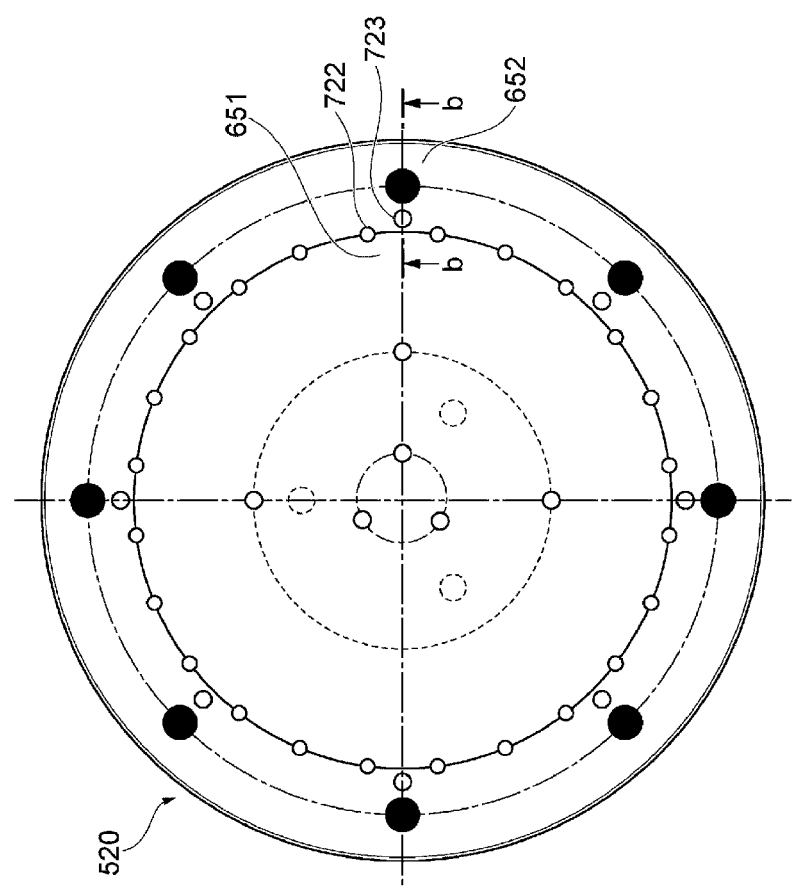
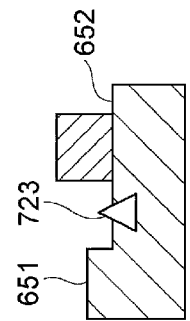
FIG. 15A
FIG. 15B

SUBSTRATE PROCESSING APPARATUS

CROSS-REFERENCE TO RELATED APPLICATION

This is a continuation application of U.S. patent application Ser. No. 18/046,567, filed on Oct. 14, 2022, which claims the benefit of Japanese Patent Application Nos. 2021-169664 and 2022-126982 filed on Oct. 15, 2021 and Aug. 9, 2022, respectively, the entire disclosures of which are incorporated herein by reference.

TECHNICAL FIELD

The various aspects and embodiments described herein pertain generally to a substrate processing apparatus.

BACKGROUND

Patent Document 1 discloses an apparatus configured to perform a heating processing while suctioning a wafer on a flat heat plate. In this apparatus, a bending state of the wafer before being subjected to the heating processing is measured, and a timing for starting the suction through each suction opening for the wafer is set according to the bending state of the wafer.

Patent Document 1: Japanese Patent Laid-open Publication No. 2007-300047

SUMMARY

In one exemplary embodiment, a substrate processing apparatus includes a heat plate configured to place a substrate thereon and heat the substrate placed thereon; multiple gap members formed along a front surface of the heat plate on which the substrate is placed, and configured to support the substrate to secure a clearance between the heat plate and the substrate; a suction unit configured to suck the substrate toward the heat plate; and an elevating pin configured to penetrate the heat plate and configured to be moved up and down to move the substrate placed on the heat plate up and down. The front surface of the heat plate has a concave region inclined downwards from an outer side toward an inner side thereof.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 13 is a diagram for describing a descending speed of an elevating pin according to a modification example;

FIG. 15A is a plan view illustrating a heat plate according to a modification example, and FIG. 15B is a cross sectional view taken along a line b-b of FIG. 15A.

DETAILED DESCRIPTION

Figure 1:
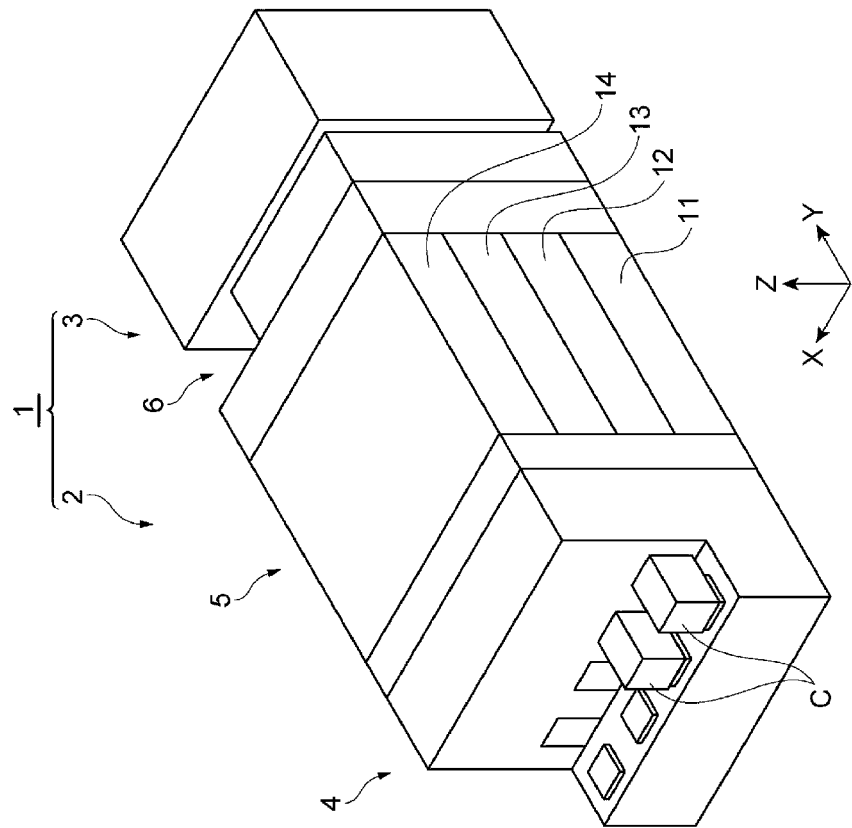
FIG. 1 is a perspective view schematically illustrating an example of a substrate processing system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments will be described with reference to the accompanying drawings. In the following description, same parts or parts having same functions will be assigned same reference numerals, and redundant description thereof will be omitted.

[Substrate Processing System]

First, referring to FIG. 1 and FIG. 2, a substrate processing system 1 will be explained. The substrate processing system 1 shown in FIG. 1 is a system configured to perform, on a wafer W, formation of a photosensitive film, exposure of the photosensitive film, and development of the photosensitive film. The wafer W as a processing target is, for example, a substrate or a substrate having a film, a circuit, or the like formed thereon as a result of being subjected to a preset processing. The substrate may be, by way of non-limiting example, a silicon wafer. The wafer W (substrate) may have a circular shape. The wafer W may be a glass substrate, a mask substrate, a flat panel display (FPD), or the like. The photosensitive film may be, by way of example, a resist film.

Figure 2:
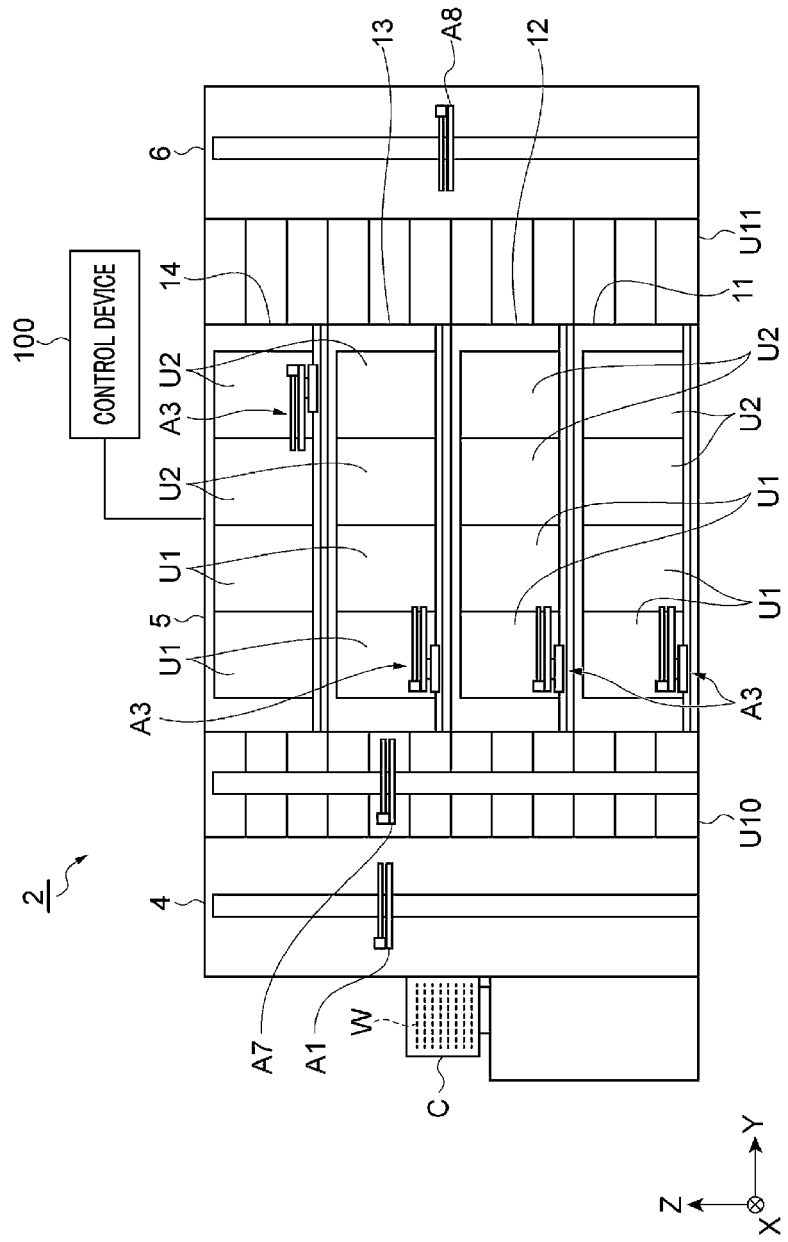
FIG. 2 is a side view schematically illustrating an example of a coating and developing apparatus.

As depicted in FIG. 1 and FIG. 2, the substrate processing system 1 includes a coating and developing apparatus 2 (substrate processing apparatus), an exposure apparatus 3, and a control device 100. The exposure apparatus 3 is configured to expose a resist film (photosensitive film) formed on the wafer W (substrate). Specifically, the exposure apparatus 3 radiates an energy beam to an exposure target portion of the resist film by an immersion exposure method or the like.

The coating and developing apparatus 2 performs a processing of forming the resist film by coating resist (chemical liquid) on a front surface of the substrate W prior to the exposure processing by the exposure apparatus 3, and also performs a developing processing of the resist film after the exposure processing. The coating and developing apparatus 2 is equipped with a carrier block 4, a processing block 5, and an interface block 6.

The carrier block 4 is configured to carry the wafer W into/from the coating and developing apparatus 2. For example, the carrier block 4 is configured to support a plurality of carriers C for the wafer W, and incorporates therein a transfer device A1 including a delivery arm. Each carrier C accommodates therein, for example, a multiple number of circular wafers W. The transfer device A1 serves to take out the wafer W from the carrier C, hand the wafer W over to the processing block 5, receive the wafer W from the processing block 5, and return the wafer W back into the carrier C. The processing block 5 includes processing modules 11, 12, 13 and 14.

The processing module 11 incorporates therein a liquid processing unit U1, a heat treatment unit U2, and a transfer device A3 configured to transfer the wafer W to these units. The processing module 11 is configured to form a bottom film on the front surface of the wafer W by the liquid processing unit U1 and the heat treatment unit U2. The liquid processing unit U1 is configured to coat, on the wafer W, a processing liquid for forming the bottom film. The heat treatment unit U2 is configured to perform various kinds of heat treatments required to form the bottom film.

The processing module 12 incorporates therein a liquid processing unit U1, a heat treatment unit U2, and a transfer device A3 configured to transfer the wafer W to these units. The processing module 12 is configured to form a resist film on the bottom film by the liquid processing unit U1 and the heat treatment unit U2. The liquid processing unit U1 is configured to coat, on the bottom film, a processing liquid for forming the resist film. The heat treatment unit U2 is configured to perform various kinds of heat treatments required to form the resist film.

The processing module 13 incorporates therein a liquid processing unit U1, a heat treatment unit U2, and a transfer device A3 configured to transfer the wafer W to these units. The processing module 13 is configured to form a top film on the resist film by the liquid processing unit U1 and the heat treatment unit U2. The liquid processing unit U1 is configured to coat, on the resist film, a processing liquid for forming the top film. The heat treatment unit U2 is configured to perform various kinds of heat treatments required to form the top film.

The processing module 14 incorporates therein a liquid processing unit U1, a heat treatment unit U2, and a transfer device A3 configured to transfer the wafer W to these units. The processing module 14 is configured to perform a developing processing for the resist film after being subjected to an exposure processing and, also, perform heat treatments required for the developing processing by the liquid processing unit U1 and the heat treatment unit U2. The liquid processing unit U1 forms a resist pattern by supplying a developing liquid onto the front surface of the wafer W after being subjected to the exposure processing and then washing away this developing liquid with a rinse liquid (that is, performs the developing processing for the resist film). The heat treatment unit U2 is configured to perform the various kinds of heat treatments required for the developing processing. Specific examples of these heat treatments include a heat treatment (PEB: Post Exposure Bake) before developing, a heat treatment (PB: Post Bake) after developing, and so forth.

Within the processing block 5, a shelf unit U10 is provided near the carrier block 4. The shelf unit U10 is partitioned into a multiple number of cells arranged in a vertical direction. A transfer device A7 including an elevating arm is provided near the shelf unit 10. The transfer device A7 is configured to move the wafer W up and down between the cells of the shelf unit U10.

Within the processing block 5, a shelf unit U11 is provided near the interface block 6. The shelf unit U11 is partitioned into a multiple number of cells arranged in the vertical direction.

The interface block 6 is configured to deliver the wafer W to/from the exposure apparatus 3. By way of example, the interface block 6 incorporates therein a transfer device A8 including a delivery arm and is connected to the exposure apparatus 3. The transfer device A8 serves to hand the wafer W placed in the shelf unit U11 over to the exposure apparatus 3. The transfer device A8 also serves to receive the wafer W from the exposure apparatus 3 and return it back into the shelf unit U11.

The control device 100 is configured to control the coating and developing apparatus 2 partially or in overall. The control device 100 controls the coating and developing apparatus 2 to perform a coating and developing processing in the following sequence, for example. First, the control device 100 controls the transfer device A1 to transfer the wafer W within the carrier C to the shelf unit U10, and controls the transfer device A7 to place this wafer W in the cell for the processing module 11.

Next, the control device 100 controls the transfer device A3 to transfer the wafer W of the shelf unit U10 to the liquid processing unit U1 and the heat treatment unit U2 within the processing module 11. Further, the control device 100 controls the liquid processing unit U1 and the heat treatment unit U2 to form the bottom film on the front surface of the wafer W. Thereafter, the control device 100 controls the transfer device A3 to return the wafer W with the bottom film formed thereon back into the shelf unit U10, and controls the transfer device A7 to place this wafer W in the cell for the processing module 12.

Next, the control device 100 controls the transfer device A3 to transfer the wafer W of the shelf unit U10 to the liquid processing unit U1 and the heat treatment unit U2 in the processing module 12. Further, the control device 100 controls the liquid processing unit U1 and the heat treatment unit U2 to form the resist film on the bottom film of the wafer W. Thereafter, the control device 100 controls the transfer device A3 to return the wafer W back into the shelf unit U10, and controls the transfer device A7 to place this wafer W in the cell for the processing module 13.

Next, the control device 100 controls the transfer device A3 to transfer the wafer W of the shelf unit U10 to each unit within the processing module 13. Further, the control device 100 controls the liquid processing unit U1 and the heat treatment unit U2 to form the top film on the resist film of the wafer W. Thereafter, the control device 100 controls the transfer device A3 to transfer the wafer W to the shelf unit U11.

Thereafter, the control device 100 controls the transfer device A8 to send the wafer W of the shelf unit U11 to the exposure apparatus 3. Then, the control device 100 controls the transfer device A8 to receive, from the exposure apparatus 3, the wafer W after being subjected to the exposure processing and place the received wafer W in the cell for the processing module 14 in the shelf unit U11.

Next, the control device 100 controls the transfer device A3 to transfer the wafer W of the shelf unit U11 to each unit within the processing module 14, and controls the liquid processing unit U1 and the heat treatment unit U2 to perform a developing processing for the resist film of the wafer W. Then, the control device 100 controls the transfer device A3 to carry the wafer W back into the shelf unit U10, and controls the transfer device A7 and the transfer device A1 to return this wafer W back into the carrier C.

Through the above-described operations, the coating and developing processing upon the single sheet of wafer W is completed. The control device 100 controls the coating and developing apparatus 2 to perform the coating and developing processing for each of the plurality of subsequent wafers W. Here, the specific configuration of the coating and developing apparatus 2 is not limited to the example described above. The coating and developing apparatus 2 may be any of various kinds as long as it has a unit configured to perform a heat treatment.

<Heat Treatment Unit>

Now, with reference to FIG. 3 to FIG. 8, an example of the heat treatment unit U2 will be described. The heat treatment unit U2 is configured to perform a heat treatment including a heating processing and a cooling processing on the wafer W. In the present exemplary embodiment, a configuration of the heat treatment unit U2 regarding the heating processing will be explained, while omitting description of a configuration regarding the cooling processing. That is, in FIG. 3, etc., illustration of the configuration of the heat treatment unit U2 for the cooling processing is omitted.

Figure 3:
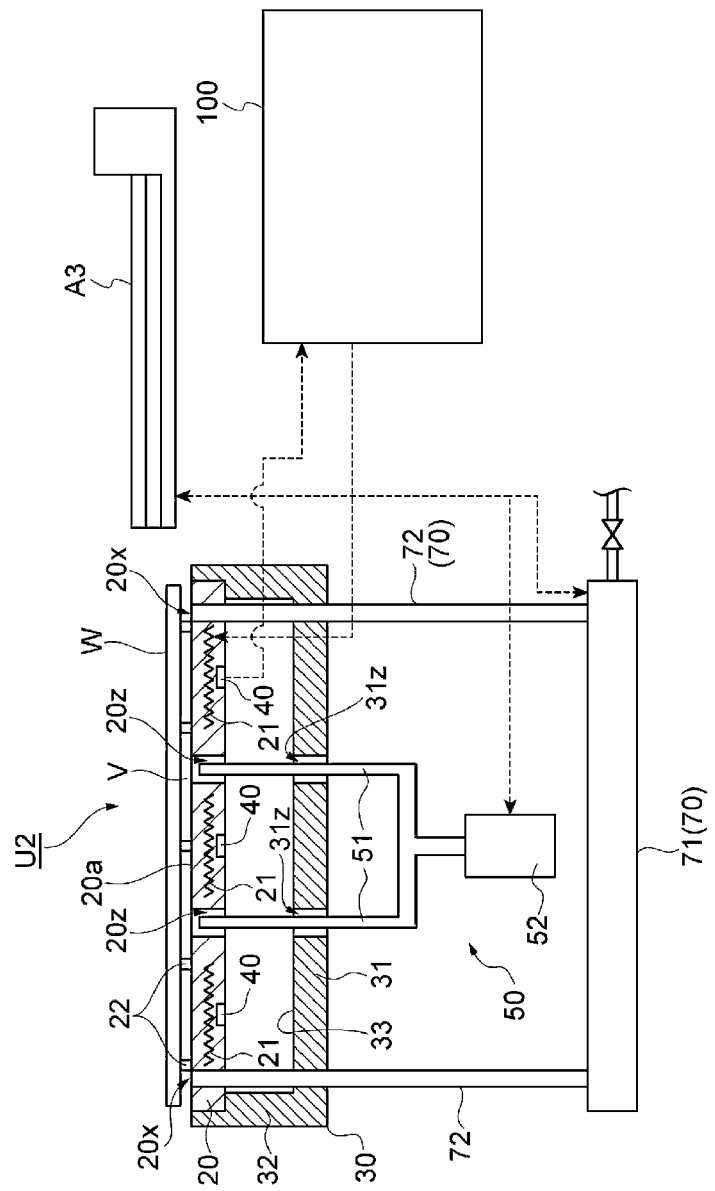
FIG. 3 is a diagram schematically illustrating an example of a heat treatment unit.

As depicted in FIG. 3, the heat treatment unit U2 includes a heat plate 20, a plurality of gap members 22, a supporting table 30, a plurality of heat plate temperature sensors 40, an elevating mechanism 50, a suction unit 70, and the control device 100.

The heat plate 20 is configured to place the wafer W thereon and heat the wafer W placed thereon. The heat plate 20 is configured to receive heat from a heater 21 (heating mechanism) and maintain a high temperature through heat conduction by a solid. The heat plate 20 may be composed of a material containing, for example, silicon carbide. The heat plate 20 has a disk shape and incorporates a plurality of heaters 21 therein. The heat plate 20 has an area equal to or larger than that of the wafer W when viewed from the top. A multiple number of through holes 20z are formed through the heat plate 20 in a thickness direction thereof. These through holes 20z are arranged to correspond to a multiple number of elevating pins 51 (to be described later), and serve as passages through which the elevating pins 51 pass when they are moved up and down.

The plurality of gap members 22 are formed along a front surface 20a of the heat plate 20 on which the wafer W is placed. The gap members 22 are proximity pins configured to support the wafer W to form a clearance V between the heat plate 20 and the wafer W. The plurality of gap members 22 are interspersed along the front surface 20a of the heat plate 20. The heights of these gap members 22 from the front surface 20a of the heat plate 20 to their leading ends in contact with the wafer W may be all same.

Figure 4:
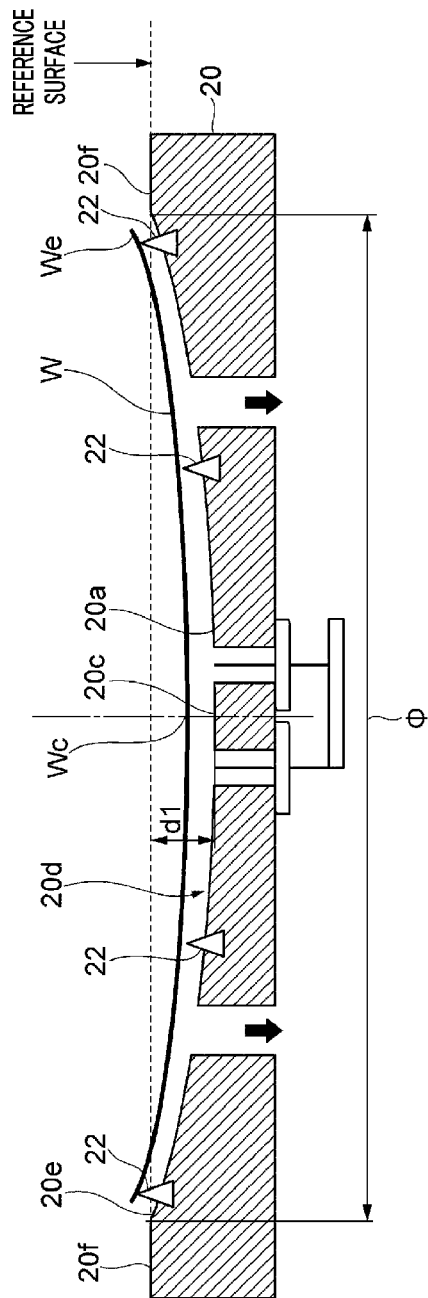
FIG. 4 is a diagram illustrating details of the shape of a heat plate.

In addition, although the heat plate 20 is shown to have a flat shape in FIG. 3, the heat plate 20 is actually formed in a concave shape so that it may be inclined downwards as it goes from an outer side toward an inner side (see FIG. 4). FIG. 4 is a diagram illustrating details of the shape of the heat plate 20.

As illustrated in FIG. 4, the front surface 20a of the heat plate 20 on which the wafer W is placed has a concave region 20d that is inclined downwards as it goes from an edge (outer side) toward a center (inner side) thereof. In the heat plate 20 according to the present exemplary embodiment, approximately the entire front surface 20a is formed as the concave region 20d, and an edge portion 20e is the most upwardly protruding region, whereas a central portion 20c is the most downwardly protruding region. That is, in the heat plate 20, the most downwardly protruding region of the concave region 20d is the region (central portion 20c) facing a central portion Wc of the wafer W in the state that the wafer W is placed on the heat plate 20. More specifically, in the front surface 20a of the heat plate 20, an outermost edge (outer side than the edge portion 20e of the concave region 20d) is formed as a flat portion 20f. Here, however, the flat portion 20f may not be provided, and a curved surface of the concave region 20d may be extended up to the outermost edge of the heat plate 20. According to this configuration, a heating effect at an edge portion of the wafer W can be improved. The shape of the front surface 20a where the concave region 20d is formed is, for example, a spherical surface (curved surface), and the curvature thereof may or may not be constant. When the curvature of the concave region 20d is not constant, the inner curvature of the concave region 20d may be set to be larger than the outer curvature thereof (so that the inner side may be deeper). According to this configuration, when the bending of the wafer W is not uniform, for example, a state in which a gap between the wafer W and the heat plate 20 on the outer side is narrower than a gap on the inner side can be created more easily when suction is performed, thus making it easier to suction the wafer W having various bending states. That is, the robustness of the suction with respect to the bending of the wafer W can be improved.

In the example shown in FIG. 4, the wafer W is a concave wafer (a substrate bent in + direction) in which a region of the central portion Wc protrudes more downwardly than the edge portion We. However, the wafer W placed on the heat plate 20 is not limited to the concave wafer, but it can be a flat wafer, or a convex wafer (a substrate bent in − direction) in which the region of the central portion We protrudes higher than the edge portion We. In consideration of the fact that wafers W having such various shapes may be placed, it is desirable to use the heat plate 20 having the above-described downwardly inclined concave region 20d. The reason for this will be described with reference to FIG. 5A and FIG. 5B.

Figure 5A:
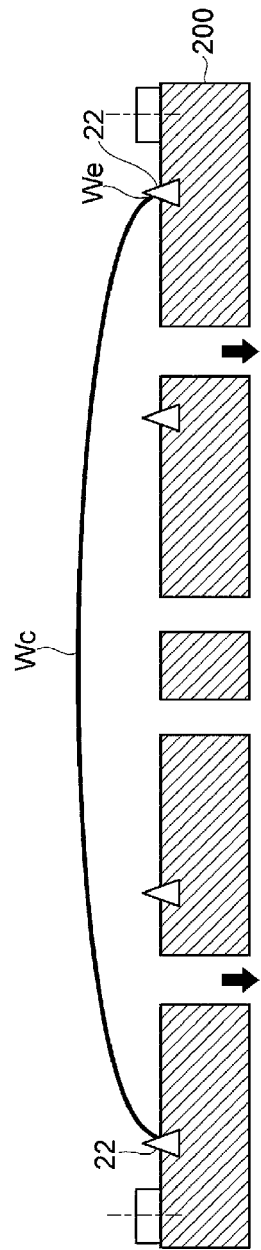
FIG. 5A is a diagram illustrating an example in which a convex wafer is placed on a flat heat plate.
Figure 5B:
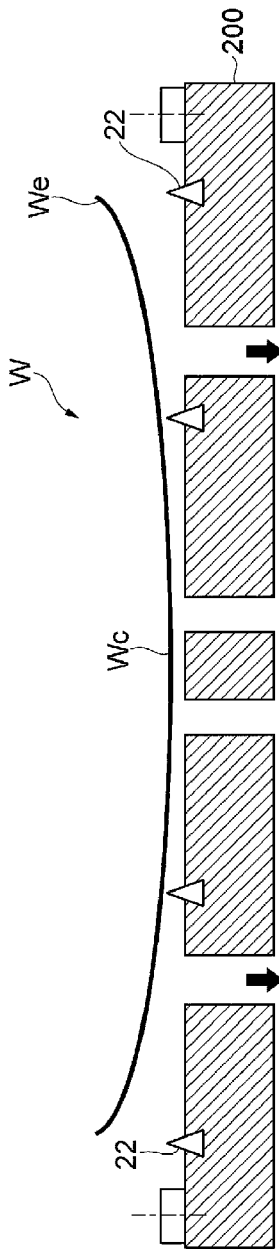
FIG. 5B is a diagram illustrating an example where a concave wafer is placed on the flat heat plate.

FIG. 5A is a diagram illustrating an example where a convex wafer W is placed on a flat heat plate 200 according to a comparative example, and FIG. 5B is a diagram illustrating an example where a concave wafer W is placed on the flat heat plate 200 according to the comparative example. As shown in FIG. 5A, in case of the convex wafer W, the edge portion We is placed on the gap members 22 on the edge side of the heat plate 200 having the flat shape. In this way, if the edge portion We of the wafer W is appropriately placed on the gap members 22, this state is as if a suction area is covered with the wafer W. Therefore, the wafer W can be properly attracted in the direction of the heat plate 200 by the suction of the suction unit 70. As for the convex wafer W and the flat-plate shape wafer W, in the heat plate 20 (see FIG. 4) having the concave region 20d according to the present exemplary embodiment as well, the edge portion We of the wafer W can be appropriately placed on the gap members 22 on the edge side. Therefore, the wafer W can be properly attracted in the direction of the heat plate 20 by the suction of the suction unit 70.

Meanwhile, as shown in FIG. 5B, in case of the concave wafer W, the edge portion We is not placed on the gap members 22 on the edge side of the heat plate 200 but it is in a floating state. In this case, the state as if being covered with the wafer W cannot be created, so that the atmosphere may be easily sucked from the edge portion We side, and airtightness is difficult to achieve. As a result, attraction property of the wafer W to the heat plate 200 is lowered. As described above, while the shape of the heat plate is not a critical factor for the convex wafer W or the flat-plate shape wafer W from the viewpoint of the attraction property of the wafer W, the attraction property of the wafer W cannot be guaranteed on the flat heat plate 200 if the wafer W has the concave shape. From this point of view, in a situation where wafers W of various shapes can be placed, it is desirable that the heat plate is formed to have a shape enabling to improve the attraction property of the concave wafer W. As described above, in the placement of the concave wafer W on the heat plate, the problem is that the edge portion We is not placed on the gap members 22 but is in the floating state. As a resolution, the above-described heat plate 20 is adopted as a heat plate that allows the edge portion We to be securely placed on the gap members 22. That is, by using the heat plate 20 having the concave region 20d that is inclined downwards as it goes from the edge side toward the center side, the shape of the concave wafer W and the shape of the heat plate 20 can be easily matched, so that the edge portion We of the wafer W can be appropriately placed on the gap members 22. As a consequence, even for the concave wafer W, the attraction property for the heat plate 20 can be improved.

A depth d1 of the concave region 20d of the heat plate 20 is set to exceed a bending amount of the concave wafer W at least. The depth d1 is a length in a height direction from the flat portion 20f as a reference plane to the central portion 20c, as shown in FIG. 4. The bending amount of the wafer W is a length in the height direction from the edge portion We of the wafer W to the central portion We thereof.

The shape of the concave region 20d of the heat plate 20 is decided as follows, for example. Assume that the concave wafer W has a diameter of 300 mm and a bending amount of 1000 μm. In this case, the radius of curvature of this wafer W is calculated as 11250.5 mm from the square root theorem. In addition, in case that a film is uniformly formed on the wafer W, the wafer W is deformed due to a difference in the linear expansion. If a cross-sectional shape of the wafer W is measured, the diameter, the bending amount and the radius of curvature meet the above-described relationship. Then, based on the radius of curvature of the wafer W, the radius of curvature of the concave region 20d of the heat plate 20 is determined. Specifically, the radius of curvature of the concave region 20d is calculated by adding a thickness of the wafer W and a height of the gap member 22 protruding from the front surface 20a to the radius of curvature (11250.5 mm) of the wafer W.

In addition, the depth d1 and the diameter ϕ of the concave region 20d of the heat plate 20 are set in consideration of a positional deviation in a robot transfer or the like as well as the size of the wafer W. To elaborate, when a transfer error of about 2 mm is taken into consideration, the depth d1 of the concave region 20d may be set to be about 1 mm, and the diameter ϕ thereof may be set to be about 304 mm. Moreover, even when the aforementioned transfer error arises, the influence upon the temperature uniformity of the wafer in the heat treatment is small.

The concave region 20d of the heat plate 20 whose shape is decided as described above can be formed by, for example, a rotary grinding machine or the like. When a process defect due to microparticles generated from the surface of the heat plate after being machined is expected, the risk of particle scattering can be reduced by performing brush polishing or annealing treatment.

Returning back to FIG. 3, the suction unit 70 attracts the wafer W toward the heat plate 20 by applying a suction force to the wafer W. The suction unit 70 applies the suction force to a plurality of regions in a rear surface of the wafer W. The suction unit 70 has a suction device 71 and a plurality of pipelines 72.

The suction device 71 is a mechanism configured to suck up a gas by the action of pressure. Each of the plurality of pipelines 72 is connected at one end to the suction device 71, and the other end thereof reaches an attraction hole 20x (a portion facing the wafer W) formed in the front surface 20a of the heat plate 20.

The supporting table 30 has a base plate 31 and a peripheral wall 32 (supporting member). The supporting table 30 may be made of a material containing stainless steel, for example. The peripheral wall 32 is provided along the periphery of the base plate 31 and supports a peripheral portion of the heat plate 20. The base plate 31 faces the heat plate 20, and supports the heat plate 20 from below with the peripheral wall 32 therebetween. In the state that the peripheral wall 32 supports the heat plate 20, a cavity 33 is formed in a space surrounded by the supporting table 30. A plurality of path holes 31z through which the elevating pins 51 (to be described later) pass are formed in the base plate 31. The plurality of path holes 31z are arranged to correspond to the multiple number of elevating pins 51, and serve as passages for the elevating pins 51 when they are moved up and down.

The plurality of heat plate temperature sensors 40 are individually provided at different positions within the heat plate 20. These heat plate temperature sensors 40 measure temperatures near the heaters 21, and transmit the measurement results to the control device 100.

Figure 6:
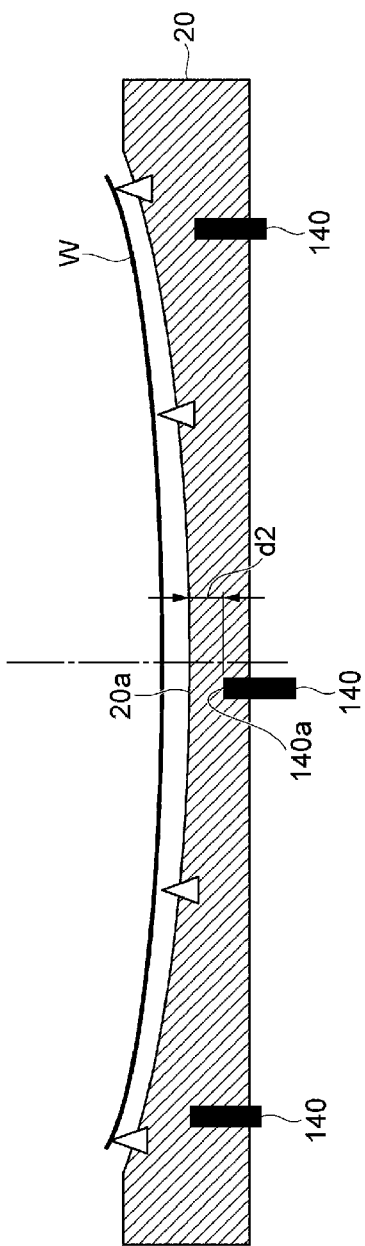
FIG. 6 is a diagram illustrating a layout of control temperature sensors.

Separately from the plurality of heat plate temperature sensors 40, a plurality of control temperature sensors 140 may be provided inside the heat plate 20 so as to correspond to different positions of the wafer W. FIG. 6 is a diagram illustrating the layout of the plurality of control temperature sensors 140. As shown in FIG. 6, it is desirable that a distance of each of the plurality of control temperature sensors 140 provided inside the heat plate 20 from the front surface 20a of the heat plate 20 is as short as possible. Specifically, it is desirable that the distance of the control temperature sensor 140 from the front surface 20a is set to be uniform as being about 1 mm to 3 mm. In addition, the plurality of control temperature sensors 140 are arranged so that lengths d2 in a height direction (vertical direction) from upper ends 140a (leading ends) thereof to the front surface 20a of the heat plate 20 are all same.

Figure 7A:
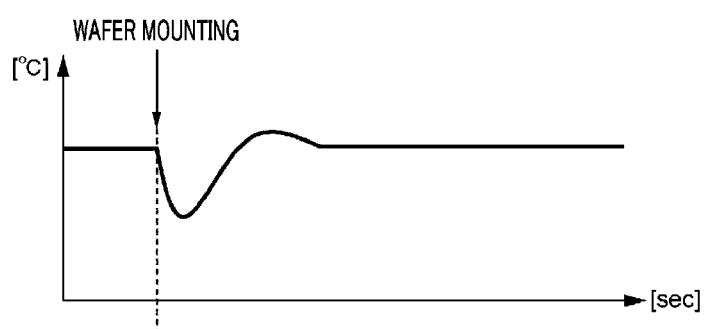
FIG. 7A is a chart illustrating a temperature control based on a temperature acquired by a control temperature sensor relatively close to the heat plate.
Figure 7B:
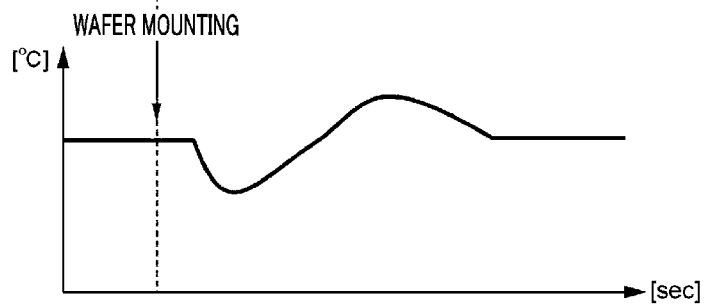
FIG. 7B is a chart illustrating a temperature control based on a temperature acquired by a control temperature sensor relatively far from the heat plate.

FIG. 7A is a chart showing a temperature control based on temperatures acquired by the control temperature sensor 140 that is relatively close in distance from the front surface 20a of the heat plate 20, and FIG. 7B is a chart showing a temperature control based on temperatures acquired by the control temperature sensor 140 which is far from the front surface 20a. In FIG. 7A and FIG. 7B, a horizontal axis represents time, and a vertical axis represents a temperature acquired by the control temperature sensor 140. As shown in FIG. 7A and FIG. 7B, the closer the control temperature sensor 140 is to the front surface 20a, the more rapidly a temporary temperature drop after the wafer W is mounted on the heat plate 20 is obtained. Thus, since a temperature raising control for the heater 21 can be started early, control responsiveness can be improved, and temperature optimization for the heat treatment can be achieved at an early stage. When the distances of the control temperature sensors 140 from the front surface 20a are different from each other, the time required to achieve the temperature optimization for the heat treatment becomes different therebetween, as can be seen from FIG. 7A and FIG. 7B. In this case, conditions for the heat treatment may become different for each area of the wafer W corresponding to each control temperature sensor 140. In this case, there is a risk that the uniformity of the heat treatment of the wafer W may be deteriorated. As a resolution, by setting the length d2 of the temperature control sensors 140 in the height direction (vertical direction) up to the front surface 20a to be uniform as stated above, the uniformity of the heat treatment of the wafer W can be improved. In this way, the temperature of the heat plate 20 is controlled based on the temperature acquired by the control temperature sensor 140 which is located closer to the front surface 20a of the heat plate 20 than the heat plate temperature sensor 40 near the heater 21 and whose distance from the front surface 20a is set to a predetermined value. As a consequence, it is possible to carry out the heat treatment more suitable for the temperature distribution of the wafer W. In addition, this control method is deemed to be desirable as a method suitable for the temperature distribution of the wafer W even for a configuration in which the distance from each heater 21 to the front surface 20a is different at individual positions, such as when the heaters 21 are provided approximately horizontally with respect to the front surface 20a having a curved surface or a step.

Referring back to FIG. 3, the elevating mechanism 50 has the multiple number of (for example, three) elevating pins 51, and a driving unit 52. The elevating pin 51 is moved up and down through the path hole 31z of the base plate 31 and the through hole 20z of the heat plate 20. An upper portion of the elevating pin 51 is protruded above the heat plate 20 as the elevating pin 51 is raised, and is accommodated within the heat plate 20 as the elevating pin 51 is lowered. The driving unit 52 incorporates therein a driving source such as a motor and an air cylinder, and serves to move the elevating pins 51 up and down. The elevating mechanism 50 moves the elevating pins 51 up and down, thus allowing the wafer W on the heat plate 20 to be moved up and down. Here, from the viewpoint of improving the effect of attraction when the wafer W is suctioned toward the heat plate 20 by the suction unit 70, it is desirable that the path hole 31z of the elevating pin 51 or the like is blocked with respect to a space below the base plate 31. Hereinafter, with reference to FIG. 8, an example of a configuration of a seal member according to the blocking of the path hole 31z or the like will be explained.

Figure 8:
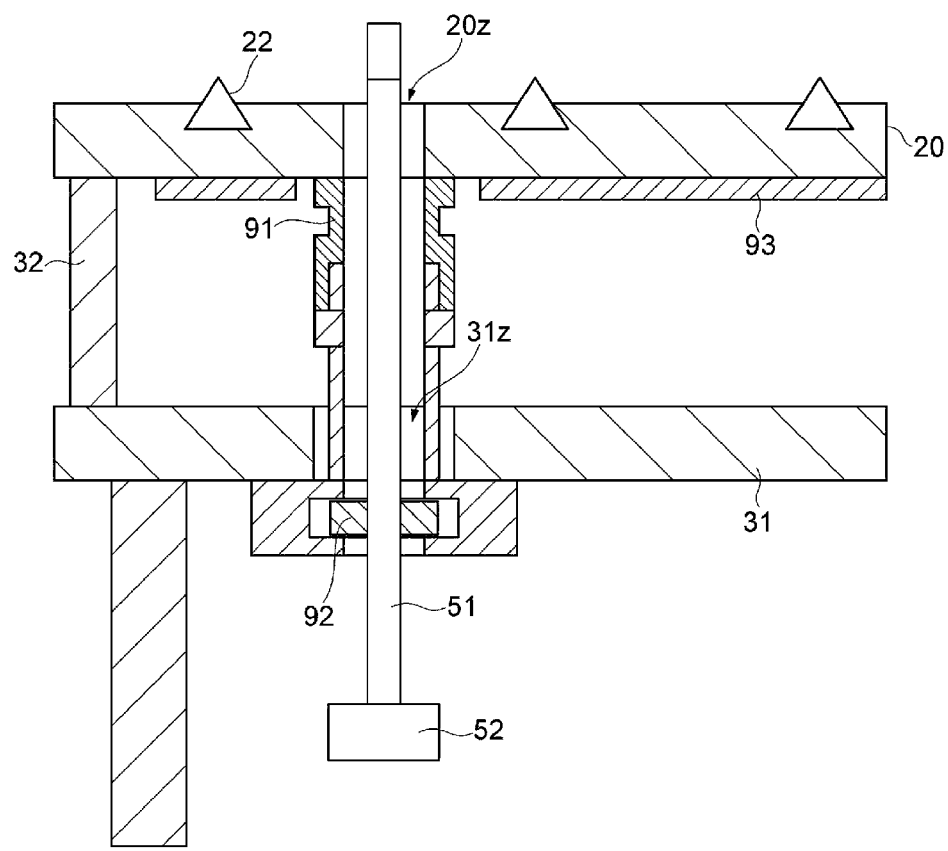
FIG. 8 is a diagram schematically illustrating an example of a configuration of a seal member.

FIG. 8 is a diagram schematically illustrating an example of the configuration of the seal member. In FIG. 8, illustration of the concave region 20d of the heat plate 20, etc., is omitted. As shown in FIG. 8, the heat treatment unit U2 includes an upper seal member 91 and a lower seal member 92 as components of the seal member. The upper seal member 91 is made of a cylindrical heat insulating material, and is provided so as to be in contact with a surface (bottom surface) of the heat plate 20 opposite to the front surface 20a. The upper seal member 91 is provided so as to surround the elevating pin 51. The upper seal member 91 has elasticity and is made of a material including, for example, resin or rubber. In addition, a heating resistor 93 may be provided in the substantially entire bottom surface of the heat plate 20.

The lower seal member 92 is configured to close the internal space of the path hole 31z of the base plate 31 and the internal space of the upper seal member 91 with respect to the space below the base plate 31. The lower seal member 92 is made of, for example, polyimide or PEEK. For example, the lower seal member 92 is provided on a bottom surface of the base plate 31, as shown in FIG. 8. Since the lower seal member 92 is disposed below the base plate 31, a heating effect on the wafer W, which is a problem caused when the lower seal member 92 with heat is positioned above it, is suppressed. In addition, by separating the lower seal member 92 from the heat source, durability of the lower seal member 92 can be improved, and maintenability of the lower seal member 92 can be improved. Further, the lower seal member 92 may be provided inside the base plate 31.

If a member having elasticity is not used as the upper seal member 91, a spring configured to press the upper seal member 91 from below may be further provided between the upper seal member 91 and the lower seal member 92. Such a spring may be provided on a holder on the base plate 31, for example.

The control device 100 serves to control the heaters 21 based on the temperatures detected by the plurality of control temperature sensors 140, control the driving unit 52 of the elevating mechanism 50, and control the transfer device A3 to perform the transfer of the wafer W from the heat plate 20. Further, the control device 100 also performs a control over a suctioning process by the suction device 71, and so forth.

Figure 9:
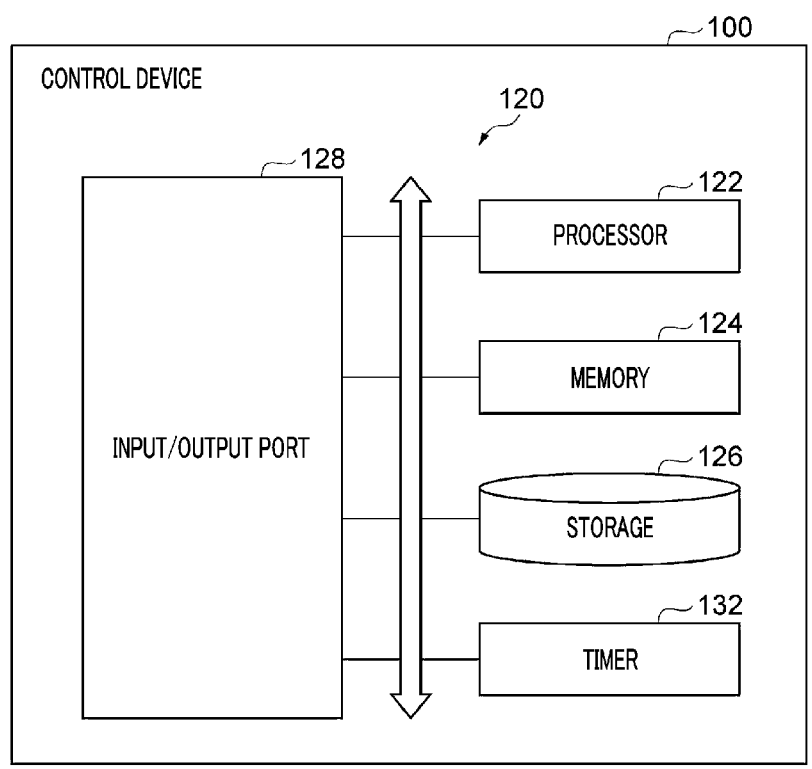
FIG. 9 is a block diagram illustrating an example of a hardware configuration of a control device.

The control device 100 is composed of one or more control computers. The control device 100 has, for example, a circuit 120 shown in FIG. 9. The circuit 120 includes one or more processors 122, a memory 124, a storage 126, an input/output port 128, and a timer 132. The storage 126 has a computer-readable recording medium such as, but not limited to, a hard disk. The recording medium stores therein a program for causing the control device 100 to perform a substrate processing method to be described later. The recording medium may be a portable medium such as a nonvolatile semiconductor memory, a magnetic disk, or an optical disk.

The memory 124 temporarily stores the program loaded from the recording medium of the storage 126 and an operation result by the processor 122. The processor 122 executes the program in cooperation with the memory 124. The input/output port 128 performs input/output of electric signals between the liquid processing unit U1 and the heat treatment unit U2 in response to an instruction from the processor 122. The timer 132 measures an elapsed time by counting a reference pulse of a certain cycle, for example.

[Operations]

In general, the flat heat plate 200 shown in FIG. 5A and FIG. 5B is used as the heat plate. In this heat plate 200, when the concave wafer W (see FIG. 5B) whose inner region protrudes downwards more than the outer region thereof is used in particular, it is difficult to appropriately attract the outer region of the wafer W even by suctioning the wafer W with the suction unit 70. Since the outer region of this wafer W having the concave shape is in the floating state (see FIG. 5B), the atmosphere may be easily sucked in and it is difficult to easily achieve the airtightness. For this reason, even when compared with, for example, the convex substrate (see FIG. 5A) whose inner region protrudes upwards, the attraction property with respect to the heat plate 200 is deteriorated.

Figure 10:
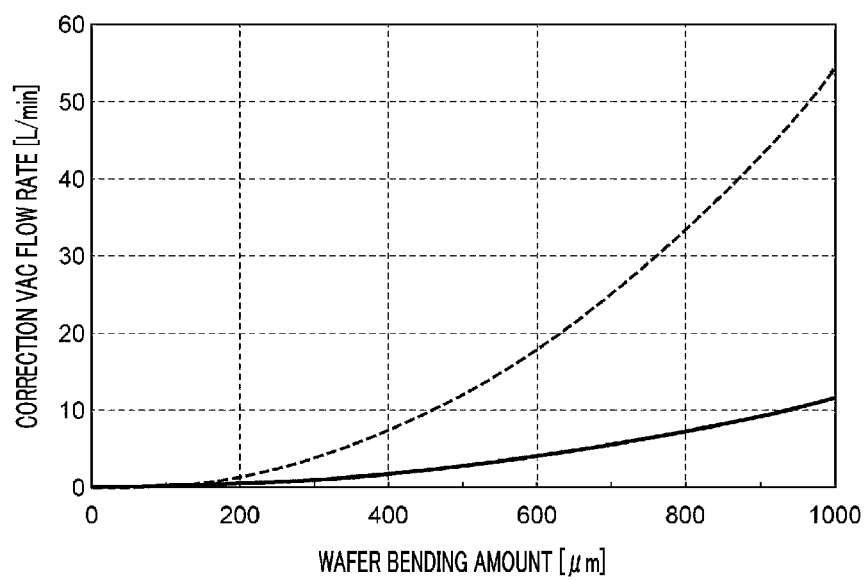
FIG. 10 is a diagram illustrating an example of a VAC flow rate required for each bending amount of a wafer.

FIG. 10 is a diagram showing an example of a VAC flow rate (vacuum rate of the suction unit 70) required for each wafer bending amount. In FIG. 10, a horizontal axis indicates a wafer bending amount, and a vertical axis represents a vacuum rate required for correcting the bending. In addition, in FIG. 10, a solid line indicates the vacuum rate for each bending amount of the wafer W having the convex shape, and a dashed line indicates the vacuum rate for each bending amount of the wafer W having the concave shape. As shown in FIG. 10, the vacuum rate is found to be particularly high in the concave wafer W. By way of example, the vacuum rate for the wafer W having the bending mount of about 1000 µm is found to be about 50 times as large as the vacuum rate of the wafer W having the bending amount of about 200 µm. Thus, the method of increasing the vacuum rate for the sake of improving the attraction property of the wafer W goes against the sustainable society, and thus cannot be said to be advantageous. In addition, the increase of the vacuum rate raises a concern that a local cool spot may be generated at an inlet portion, or that scratches and particles may be generated on the rear surface of the wafer W due to an increase of an attraction pressure. For this reason, there is a demand for device configured to increase the attraction property of the concave wafer W to the heat plate through a method other than increasing the vacuum rate.

In this regard, in the heat treatment unit U2 according to the present exemplary embodiment, since the heat plate 20 has the concave region 20d inclined downwards as it goes from the outer side toward the inner side, it is easy to make the shape of the concave wafer W conform to the shape of the heat plate 20 (specifically, the concave region 20d of the heat plate 20). With this configuration, when the wafer W is suctioned by the suction unit 70, the outer region of the concave wafer W can also be appropriately attracted to the heat plate 20. Since the wafer W can be properly attracted to the heat plate 20 in this way, the wafer W can be appropriately supported by the gap members 22, so that the heat treatment can be uniformly performed on the substrate at any regions thereof. As described above, according to the heat treatment unit U2 of the present exemplary embodiment, the attraction property of the wafer W in the heat treatment can be improved, so that the uniformity of the heat treatment can be improved.

Figures 11A, 11B:
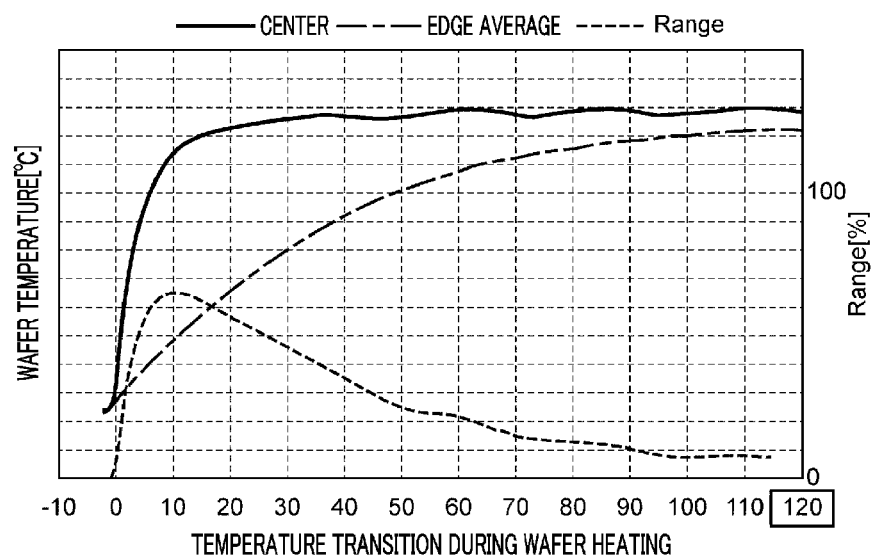
FIG. 11A and FIG. 11B are diagrams illustrating an example of a wafer temperature range for a heat plate according to a comparative example.
Figures 12A, 12B:
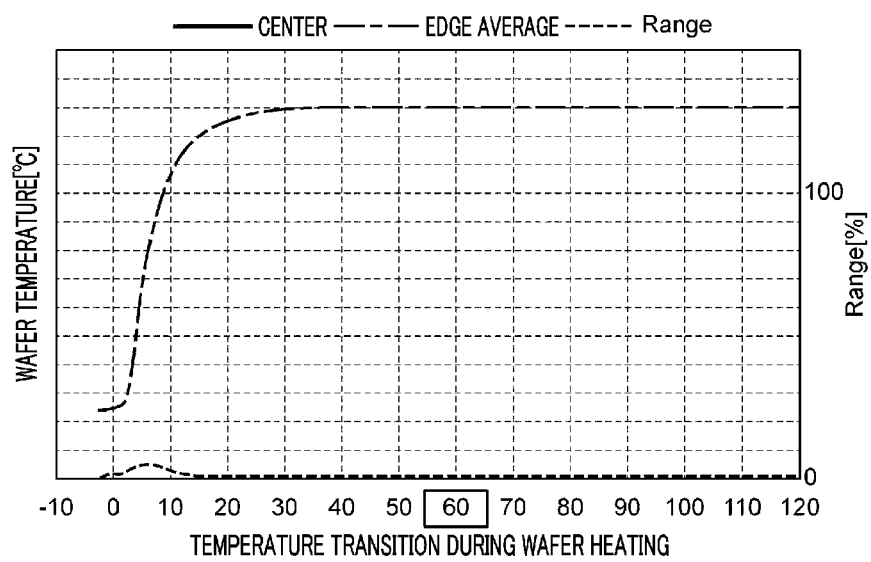
FIG. 12A and FIG. 12B are diagrams illustrating an example of a wafer temperature range for a heat plate according to the exemplary embodiment.

The effect of improving the uniformity of the heat treatment will be described in comparison with the heat plate 200 according to the comparative example. FIG. 11A and FIG. 11B are diagrams illustrating a wafer temperature range with respect to the heat plate 200 according to the comparative example. FIG. 12A and FIG. 12B are diagrams illustrating a wafer temperature range with respect to the heat plate 20 according to the present exemplary embodiment. Here, the wafer temperature range refers to information on a temperature range between a plurality of positions on the front surface 20a of the heat plate 20 obtained as a result of performing evaluation by using temperature sensors attached to those different positions. In FIG. 11A and FIG. 12A, an actual temperature difference value is shown as the wafer temperature range, and in FIG. 11B and FIG. 12B, the degree of the temperature difference is expressed in percentage (%) as the wafer temperature range. The result that the degree of the temperature difference is 0% indicates that there is no temperature difference at all. In FIG. 11B and FIG. 12B, a horizontal axis represents a temperature transition during the heating of the wafer W, and a vertical axis represents a wafer temperature and a wafer temperature range. In FIG. 11B and FIG. 12B, a solid line represents a temperature near the center of the wafer W; a dashed-dotted line represents a temperature near the edge (outer periphery) of the wafer W; and a dashed line represents a wafer temperature range. In addition, the temperatures shown in FIG. 11A and FIG. 11B and FIG. 12A and FIG. 12B are measured by a total of five thermocouples (not shown) respectively attached to the central portion of the wafer W and four edge portions distanced apart from each other by 90 degrees with respect to the central portion. In addition, the temperature indicated by the solid line is a temperature acquired by the thermocouple of the central portion, and the temperature indicated by the dashed-dotted line is the average of the temperatures acquired by the thermocouples of the four edge portions. As the wafer W, the concave wafer having the bending amount of 1000 µm is used.

As can be seen from FIG. 11A, in the heat plate 200 according to the comparative example, a temperature difference between the temperature near the center of the wafer W and the temperature near the edge of the wafer W is found to be 62.4° C. in a transient state. Further, in a steady state (for example, after the lapse of 120 seconds), the temperature difference is found to be 6.5° C. As shown in FIG. 11B, the wafer temperature range (the degree of the temperature difference between the central portion and the edge portions) does not reach 0% even when 120 seconds has elapsed. As described above, in the heat plate 200 according to the comparative example, the temperature difference between the inner side and the outer side of the wafer W is large, and even if a heating time is lengthened, the temperature difference is still generated in the surface of the wafer W, so it cannot be said that the uniformity of the heat treatment is achieved.

Meanwhile, in the heat plate 20 according to the present exemplary embodiment, the temperature range obtained by providing the control temperature sensors 140 at the multiple positions of the wafer W, the same as described above, is 0.5° C., as shown in FIG. 12A. As can be clearly seen from this point, the temperature difference is improved by about 125 times as compared to the heat plate 200 according to the comparative example. Further, in a steady state (for example, after the lapse of 60 seconds), the temperature difference is found to be 0.1° C., which is improved by about 65 times as compared to the heat plate 200 according to the comparative example. Further, as shown in FIG. 12B, the wafer temperature range (the degree of the temperature difference between the central portion and the edge portions) is maintained at around 0% from an early stage. As stated above, in the heat plate 20 according to the present exemplary embodiment, since the temperature difference between the inner side and the outer side of the wafer W is suppressed to be small from the early stage, it can be said that the uniformity of the heat treatment is improved.

The most downwardly protruding portion of the concave region 20d may face the central portion Wc of the wafer W in the state that the wafer W is placed on the heat plate 20.

According to this configuration, the shape of the heat plate 20 can be more easily made to conform to the shape of the concave wafer W, so that the attraction property of the wafer W can be improved.

The heights of the plurality of gap members 22 from the front surface 20a of the heat plate 20 to the leading ends thereof which are in contact with the wafer W may be set to be all same. According to this configuration, it is possible to suppress deterioration of the correspondence between the shape of the concave wafer W and the shape of the heat plate 20 that might be caused by being affected by the gap members 22.

The heat treatment unit U2 is further equipped with the plurality of control temperature sensors 140 provided inside the wafer W to correspond to the different positions of the wafer W and configured to measure the temperatures for use in controlling the heaters 21. These control temperature sensors 140 may be arranged such that their lengths in the height direction from the leading ends thereof to the front surface 20a of the heat plate 20 are all same. With this configuration, the temperatures for use in the control of the heaters 21 are acquired under the same conditions (conditions under which the distance from the front surface 20a of the heat plate 20 becomes uniform) for the different positions of the wafer W. Therefore, the uniformity of the heat treatment of the wafer W can be improved.

The heat treatment unit U2 is equipped with the base plate 31 configured to support the heat plate 20 from below with the peripheral wall 32 therebetween and having the path holes 31z through which the elevating pins 51 pass. Further, the heat treatment unit U2 is equipped with the upper seal member 91 which is made of the cylindrical heat insulating material and is in contact with the bottom surface of the heat plate 20 opposite to the front surface 20a. In addition, the heat treatment unit U2 is equipped with the lower seal member 92 configured to close the internal space of the path hole 31z of the base plate 31 and the internal space of the upper seal member 91 with respect to the space below the base plate 31. In this way, the internal space of the path hole 31z (the hole through which the elevating pin 51 passes) of the base plate 31 is closed by the lower seal member 92 with respect to the space below the base plate 31. Therefore, the suction effect (vacuum correction effect for the bent wafer) can be improved when the wafer W is sucked toward the heat plate 20 by the suction unit 70. Here, if only the above-described closing effect is required, it may be also possible that the seal member is not divided into the upper seal member 91 and the lower seal member 92 but is just composed of only one member. However, if the seal member composed of the only one member is provided at a position near the heat plate 20, for example, the seal member may be gradually degraded due to the thermal deterioration. According to the present exemplary embodiment, however, the seal member is divided into the upper seal member 91 and the lower seal member 92, and the upper seal member 91 made of the heat insulating material that does not interfere with the heat treatment of the heat plate 20 is provided at the position in contact with the heat plate 20. Further, the lower seal member 92 is provided at the position away from the heat plate 20 (a position not affected by the heat of the heat treatment). Thus, it is possible to avoid the gradual deterioration of the seal member, while enabling to perform the heat treatment by the heat plate 20 appropriately.

The lower seal member 92 may be provided within the base plate 31 or on the bottom surface of the base plate 31. According to this configuration, the internal space of the path hole 31z of the base plate 31 can be securely closed against the space below the base plate 31 with the lower seal member 92.

The upper seal member 91 may have elasticity. According to this configuration, it is possible to improve the contact between the upper seal member 91 and the heat plate 20 while providing a certain degree of freedom in the vertical direction for the position of the upper seal member 91.

So far, the various exemplary embodiments have been described. However, the present disclosure is not limited to the above-described exemplary embodiments, and various additions, omissions, replacements, and modifications may be made. Further, by combining the components in the various exemplary embodiments, other exemplary embodiments may be conceived.

By way of example, in the configuration in which the control device 100 controls the driving unit 52 to move the elevating pins 51 up and down, the control device 100 may control the driving unit 52 to change the descending speed of the elevating pin 51 during the descending operation.

FIG. 13 is a diagram for describing the descending speed of the elevating pin 51 according to a modification example. FIG. 13 shows an example of the speed of the elevating pin 51 in the descending operation of the elevating pin 51. In the example shown in FIG. 13, the descending operation of the elevating pin 51 is performed at a descending speed of 30 mm/s from a descending operation starting position 600 of the elevating pin 51 (that is, UP completion position of the elevating pin 51) up to a temporary stop position 601. Then, after the descending is stopped at the temporary stop position 601 for a preset time period, the descending operation of the elevating pin 51 is performed again at a descending speed of 2 mm/s from the temporary stop position 601 to a under-gap position 602 below the leading end of the gap member 22. In this case, the wafer W is placed on the gap member 22 at the descending speed of 2 mm/s. Finally, the descending operation of the elevating pin 51 is performed at a descending speed of 10 mm/s from the under-gap position 602 to a descending operation end position 603 (that is, DOWN completion position of the elevating pin 51).

That is, in the descending operation, the control device 100 controls the driving unit 52 to lower the elevating pin 51 at a first predetermined speed (for example, 30 mm/s) down to a predetermined first height (the aforementioned temporary stop position 601). Further, when the elevating pin 51 is further lowered from the first height, the control device 100 controls the driving unit 52 to lower the elevating pin 51 at a second speed (for example, 2 mm/s) that is lower than the first speed.

Then, in the descending operation, the control device 100 controls the driving unit 52 such that the elevating pin 51 that has reached the predetermined first height (the aforementioned temporary stop position 601) is stopped for a preset time period without being moved down.

The above-described control by the control device 100 is a control for suppressing large deformation of the wafer W immediately after the wafer W is mounted on the heat plate 20. For example, such a large deformation of the wafer W occurs as a balance in a surface tension of the wafer W is changed due to partial expansion of the wafer W when only the edge portion (outer periphery) of the wafer W is extremely heated, for example. In case that the wafer W has, for example, the convex shape, the edge portion of the wafer W may be easily heated first, so that the above-described large deformation is likely to occur.

Since the driving unit 52 is controlled by the control device 100 such that the descending speed after the first height becomes lower than the descending speed up to the first height, the rapid heating of the edge portion of the wafer W is suppressed when the wafer W having the convex shape is mounted on the heat plate 20. Thus, the large deformation of the wafer W, which becomes the problem caused when the edge portion of the wafer W is extremely heated, can be suppressed.

In addition, since the driving unit 52 is controlled by the control device 100 such that the elevating pin 51 is stopped at the predetermined first height for the preset time period, the rapid heating of the edge portion of the wafer W is suppressed when the wafer W having the convex shape is mounted on the heat plate 20. Therefore, it is possible to more appropriately suppress the wafer W from being largely deformed.

Moreover, the control device 100 may determine the aforementioned first height based on bending amount data of the wafer W. In this case, the substrate processing apparatus may be further equipped with an inspection unit U3 (see FIG. 14) having a periphery imaging sub-unit 400 (measuring unit) configured to measure the bending amount data of the wafer W.

Figure 14:
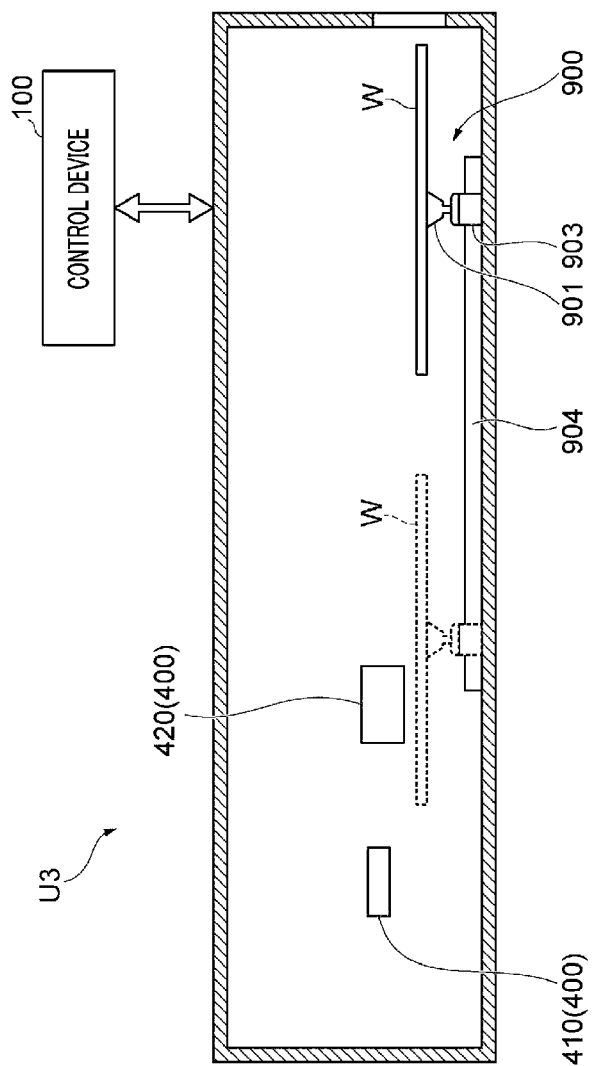
FIG. 14 is a side view illustrating an inspection unit according to a modification example.

FIG. 14 is a side view of the inspection unit U3 according to a modification example. The bending amount data of the wafer W is measured by the inspection unit U3 shown in FIG. 14. First, the control device 100 controls the individual components of the substrate processing apparatus to transfer the wafer W to the inspection unit U3. Then, the control device 100 controls a rotating/holding sub-unit 900 to hold the wafer W on a holding table 901. Next, the control device 100 controls the rotating/holding sub-unit 900, causing the holding table 901 to be moved to a predetermined imaging position along a guide rail 904 by an actuator 903.

Next, the control device 100 controls the rotating/holding sub-unit 900 to allow the holding table 901 to be rotated by the actuator 903. As a result, the wafer W is rotated. In this state, the control device 100 controls the periphery imaging sub-unit 400 to perform the imaging with a camera 410 while turning on a light source of a lighting module 420. As a result, an end surface of the wafer W is imaged along the entire circumference of the wafer W. The obtained images of the end surface of the wafer W are used as the bending amount data for specifying the bending amount of the wafer W.

The control device 100 calculates a profile line of the wafer W based on the obtained images of the end surface of the wafer W. Specifically, the control device 100 identifies upper and lower edges of the end surface of the wafer W from the obtained images based on, for example, a contrast difference. Then, the control device 100 calculates a line passing through a midway position between the upper edge and the lower edge as the profile line. The control device 100 calculates the bending amount of the wafer W by subtracting a profile line of a reference wafer (a wafer whose bending amount is known) from the calculated profile line.

Then, the control device 100 determines the aforementioned first height in consideration of the bending amount of the wafer W calculated based on the bending amount data. In this way, since the first height, which is a speed change point, is determined in consideration of the actual bending amount of the wafer W, the rapid heating of the edge portion of the wafer W can be suppressed more appropriately in consideration of the actual shape of the wafer W.

In addition, the bending amount data of the wafer W may not necessarily be measured by the inspection unit U3. The bending amount data of the wafer W may be, for example, data previously measured by another apparatus to be stored in the substrate processing apparatus.

FIG. 15A is a plan view of a heat plate 520 according to another modification example, and FIG. 15B is a cross sectional view taken along a line b-b of FIG. 15A. As depicted in FIG. 15A and FIG. 15B, a surface height of an outer peripheral region 652 of the heat plate 520 may be lower than a surface height of an inner region 651. According to this configuration, when the wafer W having the convex shape is placed on the heat plate 520, the rapid heating of the edge portion of the wafer W that might be caused when the edge portion of the wafer W collides with the outer peripheral region 652 of the heat plate 520 can be suppressed, so that the large deformation of the wafer W can be suppressed.

A difference in the surface height between the outer peripheral region 652 and the inner region 651 may be smaller than 0.2 mm (e.g., about 0.1 mm). In case that the wafer W of the flat shape without having irregularities is placed on the heat plate 520, when the difference in the surface height between the outer peripheral region 652 and the inner region 651 is large, there is a risk that the heat treatment may not be appropriately performed. In this regard, by setting the difference in the surface height between the outer peripheral region 652 and the inner region 651 to be less than 0.2 mm, the heat treatment can be carried out appropriately even when the flat wafer W is placed on the heat plate 520.

Furthermore, as shown in FIG. 15A, fixed pins 722 may be provided as gap members near a boundary between the outer peripheral region 652 and the inner region 651 to support the wafer W. In the example shown in FIG. 15A, twenty four fixed pins 722 are provided over the entire circumference of the boundary. As described above, since the fixed pins 722 are provided near the boundary between the outer peripheral region 652 and the inner region 651, the edge portion of the wafer W having the convex shape can be more appropriately suppressed from colliding with the outer peripheral region 652.

In addition, the surface height of the outer peripheral region 652 may be set to be uniform (constant height without variations) over the whole region. Therefore, the heat treatment upon the edge portion of the wafer W can be performed suitably.

Moreover, as shown in FIG. 15A and FIG. 15B, in the outer peripheral region 652, fixed pins 723 which support the wafer W may be further provided as gap members. With this configuration, it is possible to more appropriately suppress the edge portion of the wafer W having the convex shape from colliding with the outer peripheral region 652. Also, as shown in FIG. 15B, the height of the fixed pin 723 may be higher than that of the outer peripheral region 652 and lower than that of the inner region 651.

Here, various exemplary embodiments included in the present disclosure are described in [E1] to [E16] below.

[E1]

A substrate processing apparatus includes a heat plate configured to place a substrate thereon and heat the substrate placed thereon; and multiple gap members formed along a front surface of the heat plate on which the substrate is placed, and configured to support the substrate to secure a clearance between the heat plate and the substrate. Further, the substrate processing apparatus includes a suction unit configured to suck the substrate toward the heat plate; and an elevating pin configured to penetrate the heat plate and configured to be moved up and down to move the substrate placed on the heat plate up and down. The front surface of the heat plate of the substrate processing apparatus has a concave region inclined downwards from an outer side toward an inner side thereof.

[E2]

The substrate processing apparatus described in [E1], wherein a most downwardly protruding portion of the concave region faces a central portion of the substrate in a state that the substrate is placed on the heat plate.

[E3]

The substrate processing apparatus described in [E1] or [E2],
wherein the multiple gap members are same in a height from the front surface of the heat plate on which the multiple gap members are provided to leading ends thereof, the leading ends being in contact with the substrate.

[E4]

The substrate processing apparatus described in any one of [E1] to [E3],
wherein the heat plate is a plate-shaped member configured to receive heat from a heating mechanism and maintain a high temperature by heat conduction through a solid, and the heat plate has an area equal to or larger than that of the substrate when viewed from a top,
the substrate processing apparatus further includes multiple temperature sensors provided within the heat plate to respectively correspond to different positions of the substrate and configured to measure a temperature to control the heating mechanism, and
the multiple temperature sensors are arranged such that lengths of these temperature sensors in a height direction from leading ends thereof to the front surface of the heat plate are equal.

[E5]

The substrate processing apparatus described in any one of [E1] to [E4], further including:
a base plate, configured to support the heat plate from below with a supporting member therebetween, having a path hole through which the elevating pin passes;
an upper seal member made of a cylindrical heat insulating material and in contact with a bottom surface of the heat plate opposite to the front surface; and
a lower seal member configured to close an internal space of the path hole of the base plate and an internal space of the upper seal member with respect to a space below the base plate.

[E6]

The substrate processing apparatus described in [E5], wherein the lower seal member is provided within the base plate or provided on a bottom surface of the base plate.

[E7]

The substrate processing apparatus described in [E5] or [E6],
wherein the upper seal member has elasticity.

[E8]

The substrate processing apparatus described in any one of [E1] to [E7], further including:
a driving unit configured to move the elevating pin up and down; and
a control device configured to control the driving unit to move the elevating pin up and down,
wherein the control device controls the driving unit to change a descending speed of the elevating pin in a descending operation of the elevating pin.

[E9]

The substrate processing apparatus described in [E8], wherein the control device controls the driving unit such that the elevating pin is lowered at a predetermined first speed up to a preset first height, and such that the elevating pin is lowered at a second speed lower than the first speed when the elevating pin is further lowered from the first height.

[E10]

The substrate processing apparatus described in [E9], wherein the control device controls the driving unit such that, in the descending operation, the elevating pin that has reached the first height is stopped for a preset time period without being lowered.

[E11]

The substrate processing apparatus described in [E9] or [E10],
wherein the control device decides the first height based on bending amount data of the substrate.

[E12]

The substrate processing apparatus described in [E11], further including:
a measuring unit configured to measure the bending amount data of the substrate.

[E13]

The substrate processing apparatus described in any one of [E1] to [E12],
wherein a surface height of an outer peripheral region of the heat plate is lower than a surface height of an inner region thereof.

[E14]

The substrate processing apparatus described in [E13], wherein a difference in the surface height between the outer peripheral region and the inner region is less than 0.2 mm.

[E15]

The substrate processing apparatus described in [E13] or [E14],
wherein the multiple gap members have fixed pins provided near a boundary between the outer peripheral region and the inner region to support the substrate.

[E16]

The substrate processing apparatus described in any one of [E13] to [E15],
wherein the surface height of the outer peripheral region is uniform.

According to the exemplary embodiment, it is possible to provide the substrate processing apparatus capable of improving the uniformity of the heat treatment by bettering the attraction property of the substrate in the heat treatment.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

The claims of the present application are different and possibly, at least in some aspects, broader in scope than the claims pursued in the parent application. To the extent any prior amendments or characterizations of the scope of any claim or cited document made during prosecution of the parent could be construed as a disclaimer of any subject matter supported by the present disclosure, Applicants hereby rescind and retract such disclaimer. Accordingly, the references previously presented in the parent applications may need to be revisited.

We claim:

1. A substrate processing apparatus, comprising:
a heat plate having a through hole, and configured to place a substrate thereon and heat the substrate placed thereon;
multiple gap members formed along a front surface of the heat plate on which the substrate is placed, and configured to support the substrate to secure a clearance between the heat plate and the substrate;
a suction unit configured to suck the substrate toward the heat plate; and
an elevating pin configured to penetrate the heat plate through the through hole and configured to be moved up and down to move the substrate placed on the heat plate up and down,
wherein the front surface of the heat plate has a concave region inclined downwards from an outer side toward an inner side thereof, and
wherein a surface height of an outer peripheral region of the heat plate is lower than a surface height of an inner region of the heat plate.

2. The substrate processing apparatus of claim 1,
wherein a most downwardly protruding portion of the concave region faces a central portion of the substrate in a state that the substrate is placed on the heat plate.

3. The substrate processing apparatus of claim 1,
wherein the multiple gap members are same in a height from the front surface of the heat plate on which the multiple gap members are provided to leading ends thereof, the leading ends being in contact with the substrate.

4. The substrate processing apparatus of claim 1,
wherein the heat plate is a plate-shaped member configured to receive heat from a heating mechanism and maintain a high temperature by heat conduction through a solid, and the heat plate has an area equal to or larger than that of the substrate when viewed from a top,
the substrate processing apparatus further comprises multiple temperature sensors provided within the heat plate to respectively correspond to different positions of the substrate and configured to measure a temperature to control the heating mechanism, and
the multiple temperature sensors are arranged such that lengths of these temperature sensors in a height direction from leading ends thereof to the front surface of the heat plate are equal.

5. The substrate processing apparatus of claim 1, further comprising:
a base plate, configured to support the heat plate from below with a supporting member therebetween, having a path hole corresponding to the through hole of the heat plate and through which the elevating pin passes;
an upper seal member made of a cylindrical heat insulating material and in contact with a bottom surface of the heat plate opposite to the front surface; and
a lower seal member configured to close an internal space of the path hole of the base plate and an internal space of the upper seal member with respect to a space below the base plate.

6. The substrate processing apparatus of claim 5,
wherein the lower seal member is provided within the base plate or provided on a bottom surface of the base plate.

7. The substrate processing apparatus of claim 5,
wherein the upper seal member has elasticity.

8. The substrate processing apparatus of claim 1, further comprising:
a driving unit configured to move the elevating pin up and down; and
a control device configured to control the driving unit to move the elevating pin up and down,
wherein the control device controls the driving unit to change a descending speed of the elevating pin in a descending operation of the elevating pin.

9. The substrate processing apparatus of claim 8,
wherein the control device controls the driving unit such that, in the descending operation, the elevating pin is lowered at a predetermined first speed up to a preset first height, and such that the elevating pin is lowered at a second speed lower than the first speed when the elevating pin is further lowered from the first height.

10. The substrate processing apparatus of claim 9,
wherein the control device controls the driving unit such that, in the descending operation, the elevating pin that has reached the first height is stopped for a preset time period without being lowered.

11. The substrate processing apparatus of claim 9,
wherein the control device decides the first height based on bending amount data of the substrate.

12. The substrate processing apparatus of claim 11, further comprising:
a measuring unit configured to measure the bending amount data of the substrate.

13. The substrate processing apparatus of claim 1,
wherein a difference in the surface height between the outer peripheral region and the inner region is less than 0.2 mm.

14. The substrate processing apparatus of claim 1,
wherein the multiple gap members have fixed pins provided near a boundary between the outer peripheral region and the inner region to support the substrate.

15. The substrate processing apparatus of claim 1,
wherein the surface height of the outer peripheral region is uniform.

* * * * *